United States Patent [19]

Saunier et al.

[11] Patent Number: 4,558,337

[45] Date of Patent: Dec. 10, 1985

[54] MULTIPLE HIGH ELECTRON MOBILITY TRANSISTOR STRUCTURES WITHOUT INVERTED HETEROJUNCTIONS

[75] Inventors: Paul Saunier, Garland; Hung-Dah Shih, Plano, both of Tex.

[73] Assignee: Texas Instruments Inc., Dallas, Tex.

[21] Appl. No.: 615,978

[22] Filed: May 30, 1984

[51] Int. Cl.[4] .................... H01L 29/80; H01L 29/205
[52] U.S. Cl. ......................................... 357/22; 357/16
[58] Field of Search ..................... 357/22, 16

[56] References Cited

U.S. PATENT DOCUMENTS

| 3,322,575 | 5/1967 | Ruehrwein | 357/16 |
| 3,748,480 | 7/1973 | Coleman | 357/16 |
| 4,455,564 | 6/1984 | Delagebeaudeuf et al. | 357/22 |

FOREIGN PATENT DOCUMENTS 58-40855  3/1983  Japan ................................. 357/23.2
58-70573  4/1983  Japan ..................................... 357/22

OTHER PUBLICATIONS

1983 IEEE IEDM Late News Paper #5.8 Dec. 5, 1983 Luryi et al, "Unipolar Transistor Based on Charge Injection".

Primary Examiner—Martin H. Edlow
Assistant Examiner—Jerome Jackson, Jr.

[57] ABSTRACT

A multiple high electron mobility transistor structure without inverted heterojunctions is disclosed. Multiple normal heterojunctions of doped aluminum gallium arsenide grown on gallium arsenide without alternating inverted heterojunctions of gallium arsenide grown on doped aluminum gallium arsenide is achieved by grading undoped aluminum gallium arsenide from the doped aluminum gallium arsenide to the gallium arsenide to avoid an inverted heterojunction.

12 Claims, 4 Drawing Figures

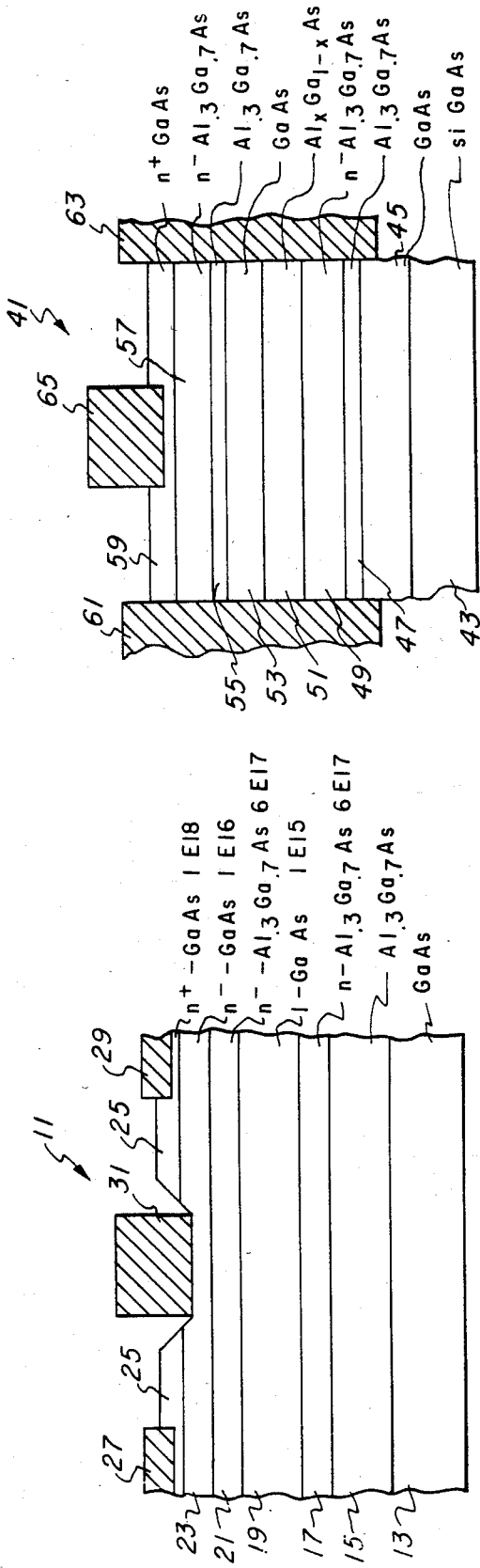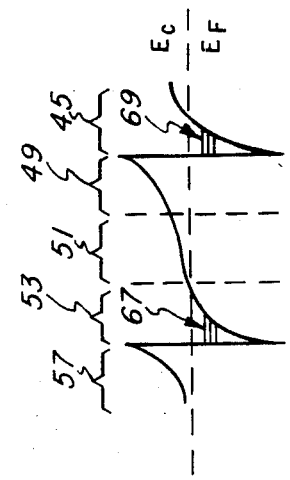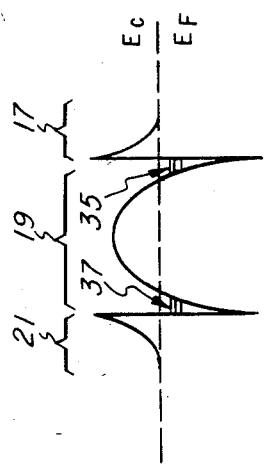

MULTIPLE HIGH ELECTRON MOBILITY TRANSISTOR STRUCTURES WITHOUT INVERTED HETEROJUNCTIONS

BACKGROUND OF THE INVENTION

This invention relates to semiconductor electronic devices, and, more particularly, to high electron mobility transistors.

Increasing the performance (i.e., smaller propogation delays, larger current, larger band widths, etc.) of semiconductor devices such as silicon field effect transistors (FETs) can be approached in at least two ways: (1) scaling down the size of the devices and (2) increasing the carrier channel mobility. With regard to the second approach, substituting gallium arsenide for silicon may increase mobility at room temperature by a factor of about six; but, more importantly, using gallium arsenide/doped aluminum gallium arsenide heterojunction structures can yield a further gain in mobility, especially at liquid nitrogen temperatures. See, generally, R. Eden, Comparison of GaAs device approaches for ultrahigh-speed VLSI, 70 Proceedings of the IEEE 5 (1982). Such heterojunction structures consist of an n-type doped layer of AlGaAs joining an undoped GaAs layer; the wider band gap of the AlGaAs leads to the donated electrons transfering into the conduction bands of the GaAs, which are at lower energies, and leaving behind the donor ions in the AlGaAs. This separation of the donated electrons from the donor ions significantly reduces impurity scattering and enhances mobility, particularly at lower temperatures.

Heterojunctions generally and AlGaAs/GaAs in particular can be grown by liquid-phase epitaxy (LPE), molecular beam epitaxy (MBE), and metal-organic chemical vapor deposition (MOCVD). MBE and MOCVD are preferably to LPE and can grow alternating epitaxial layers of AlGaAs and GaAs with layer thicknesses below 50A for MOCVD and below 10A for MBE. However, successful heterojunction devices are invariably fabricated with the doped AlGaAs being epitaxially grown on the undoped GaAs, and this is called the "normal" structure. Conversely, the "inverted" structure is with the undoped GaAs epitaxially grown on the doped AlGaAs. The drawbacks of the normal structure include the need to make a rectifying gate contact (Schottky barrier) on the rapidly oxidizing AlGaAs, and having the AlGaAs on top in these devices makes them more susceptible to degradation. For these reasons, the inverted structure is preferable; also the inverted structure provides better electron confinement. Nevertheless, the potential advantages of the inverted structure have been offset by difficulties in obtaining the mobility enhancement that has been obtained in the normal structure. See, R. Thorne et al, Performance of Inverted Structure Modulation Doped Schottky Barrier Field Effect Transistors, 21 Jap. J. App. Phy. L223 (1982). Indeed, the poor performance of inverted structure devices shows up as a low transconductance and a failure to pinch off.

One of the limitations of the normal structure device (typically called a "high electron mobility transistor" or HEMT) is the fairly low current capability compared to a standard GaAs FET. The obvious solution of growing multiple alternating layers of AlGaAs and GaAs to form a sort of multi channel HEMT would appear to overcome this current limitation problem; however, as just discussed, the inverted structures alternating between the normal structures would lead to poor performance for such a multi channel HEMT. Consequently, it is a problem in the prior art to fabricate a normal structure HEMT with large current capability.

SUMMARY OF THE INVENTION

A preferred embodiment of the present invention provides a multiple normal structure AlGaAs/GaAs high electron mobility transistor (HEMT) without alternating inverted structures by grading undoped AlGaAs from undoped GaAs to the doped AlGaAs. Thus the inverted structure junction and corresponding conduction band edge discontinuity are essentially spread out over space and converted to a continuous change in the conduction band edge. This preferred embodiment solves the problems of the prior art by permitting the use of multiple normal structures to increase the current capability of a HEMT without the necessity of incorporating inverted structures which would degrade device performance.

BRIEF DESCRIPTION OF THE DRAWINGS

FIG. 1 is a schematic cross sectional view of a device incorporating both normal and inverted structures;

FIG. 2 is a conduction band edge diagram for the device of FIG. 1;

FIG. 3 is a schematic cross section of a preferred embodiment device showing two normal structures and no intervening inverted structure; and FIG. 4 is a conduction band edge diagram for the device of FIG. 3.

DETAILED DESCRIPTION OF THE PREFERRED EMBODIMENTS

In order to fully understand the first preferred embodiment of the inventive device, an understanding of the prior art device is useful. Consequently, FIG. 1 shows a schematic cross section of a prior art device, generally designated 11, which includes semi insulating GaAs substrate 13, undoped $Al_{0.3}Ga_{0.7}As$ layer 15, n-$Al_{0.3}Ga_{0.7}As$ layer 17, undoped or very lightly n-type GaAs layer 19, n-$Al_{0.3}Ga_{0.7}As$ layer 21, n$^-$-GaAs layer 23, n$^+$GaAs layer 25, source 27 drain 29, and gate 31. Layer 15 may be 5000A thick, layer 17 may be 260A thick and doped to 6E 17 atoms per cubic centimeter, layer 19 may be 600A thick and doped to 1E15, layer 21 may be 260A thick and doped to 6E17, layer 23 may be 400A thick and doped to 1E16, layer 25 may be 300A thick and doped to 1E18, source 27 and drain 29 form ohmic contacts with layer 25 and gate 31 forms a rectifying contact (Schottky barrier) with layer 23. Undoped layers of $Al_{0.3}Ga_{0.7}As$ of thickness of 100A or less may be inserted between the n-$Al_{0.3}Ga_{0.7}As$ and the undoped GaAs as spacers to further separate the donated electrons from their donor ions, as further explained below. This particular device appears in S. Long et al., High speed GaAs Integrated Circuits, 70 Proceedings of the IEEE 35 (1982).

The characteristics of device 11 can now be described. Substrate layer 13 is semi insulating and does not contribute to the action of device 11. Layer 15 is a buffer layer and undoped. Layer 17 is heavily doped n-type $Al_{0.3}Ga_{0.7}As$ and is the source of the electrons for the inverted structure junction formed by layers 17 and 19. Layer 19 is undoped or very lightly doped GaAs, and due to different electron affinities and the smaller band gap of GaAs (approximately 1.42 eV)

compared to the band gap of $Al_{0.3}Ga_{0.7}As$ (approximately 1.72 eV), the conduction band of the GaAs has a bottom edge lower in energy than that of the doped conduction band of the $Al_{0.3}Ga_{0.7}As$ of layer 17 near the junction of layers 17 and 19. Consequently, the donated electrons in the conduction band of the $Al_{0.3}Ga_{0.7}As$ diffuse into and are trapped in the conduction band of the GaAs. This results in a separation of the electrons from their donor ions which remain fixed in the $Al_{0.3}Ga_{0.7}As$ layer 17. This separation of charge creates an internal electric field which leads to a quasi-triangular potential well in which the electrons are bound and behave dynamically as a two-dimensional electron gas. Note that FIG. 2 is an illustration of the conduction band edge in which left to right which correspond to the vertical direction top to bottom in FIG. 1. Thus, the right hand discontinuity of FIG. 2 corresponds to the junction between layers 17 and 19 (this is an inverted structure because the GaAs was grown on the AlGaAs). As shown by region 35 in FIG. 2, the curvature of the conduction band illustrates the donated electrons from layer 17 accumulated near the interface between layers 17 and 19 and not spread out uniformly over layer 19.

The junction between layers 19 and 21, layer 21 being essentially identical to layer 17 in composition, is similar in operation to the just described junction between layers 17 and 19; namely, the donated electrons from layer 21 diffuse into and are trapped in layer 19 near the junction (region 37 in FIG. 2). The junction between layers 19 and 21 is a normal structure because the $Al_{0.3}Ga_{0.7}As$ has been grown on the GaAs.

Layers 23 and 25 are merely for good electrical contact with the source 27 metallization and drain 29 metallization; gate 31 forms a Schottky barrier with layer 23, and bias of gate 31 pinches the conduction channel (the upper and lower portions of layer 19 in FIG. 1 and regions 35 and 37 in FIG. 2) as with the usual MESFET operation.

The two heterojunctions (one normal and one inverted) of device 11 could be repeated by inserting more alternating layers of dope $Al_{0.3}Ga_{0.7}As$ and undoped GaAs. The resulting structure would have a conduction band edge diagram similar to a series of copies of FIG. 2; the advantage of such a multiple layer structure would be an increase in the current carrying capability.

The problem with device 11 is the necessary inclusion of inverted structures; i.e., the junction between layers 17 and 19. Such inverted structures do not perform as expected, and they degrade the overall performance of device 11 and similar devices.

A first preferred embodiment of the inventive device, denoted generally 41, is illustrated in schematic cross section in FIG. 3. Device 41 includes a semi insulating GaAs substrate layer 43, an undoped GaAs layer 45 which is one micron thick, an undoped $Al_{0.3}Ga_{0.7}As$ layer 47 which is 70A thick, an n-type doped $Al_{0.3}Ga_{0.7}As$ layer 49 which is 500A thick and doped in 1E18, layer 51 which is 500A thick and is composed of undoped $Al_xGa_{1-x}As$ with x continuously varying between 0 and 0.3 from top to bottom of layer 51, layer 53 which is undoped GaAs 500A thick, layer 55 which is undoped $Al_{0.3}Ga_{0.7}As$ and 70A thick (layer 55 is analogous to layer 47), layer 57 which is n-type $Al_{0.3}Ga_{0.7}As$ 500A thick and doped to 1E18, layer 59 which is heavily doped n-type GaAs 100A thick and for electrical contact purposes, region 61 which is the source metallization, region 63 which is the drain metallization, both regions 61 and 63 making ohmic contact, and region 65 which is the gate forming a Schottky barrier with layer 59.

The characteristics and operation of device 41 can now be explained. First, layers 45, 47 and 49 form a normal structure (layer 47 is merely a spacer to separate the positive donor ions in layer 49 from the two dimensional electron gas that accumulates along the top of layer 45) as previously described. Analogously, layers 53, 55 and 57 form a second normal structure (again, layer 55 is a spacer). FIG. 4 shows the conduction band edge diagram for device 41; from left to right in FIG. 4 is from top to bottom in FIG. 3. Note that separation layers 47 and 55 have been omitted from FIG. 4 for simplicity, and would only contribute to the degree of bending of the conduction band edge. Also varying the doping levels would vary the diagram, but not the continuity of the band edge. More importantly, note that the graded layer 51 eliminates the inverted structure between the two normal structures (layers 45, 47 and 49 and layers 53, 55, and 57), and this appears in FIG. 4 as continuous conduction band edge without the discontinuity of a junction.

As with the usual normal structure, the donated electrons from the doped $Al_{0.3}Ga_{0.7}As$ are trapped in the GaAs near the junctions forming two dimensional electron gases as illustrated by regions 67 and 69 in FIG. 4. These regions correspond to the upper portions of layers 53 and 45 in FIG. 3.

A double normal structure test bar corresponding to device 41 and a single normal structure control test bar (corresponding to just layers 53, 55, 57 and 59) were were fabricated by MBE and compared to determine if the graded layer 51 has any impact of the mobilities or electron gas concentration. The results of Van der Pauw-Hall measurements were as follows:

|  | Mobility ($cm^2/Vs$) | | Sheet Carrier Concentration ($cm^{-2}$) | |
| --- | --- | --- | --- | --- |
|  | 300K | 77K | 300K | 77K |
| DOUBLE NORMAL STRUCTURE | 7670 | 53,800 | 1.6E12 | 1.5E12 |
| SINGLE NORMAL STRUCTURE | 8000 | 69,000 | 7.5E11 | 6.7E11 |

The foregoing measurements illustrate the lack of performance degradation by the use of graded layer 51 to eliminate inverted structures.

Other preferred embodiments of the inventive device include three or more normal structures separated by graded AlGaAs layers, varying the doping levels and layer thicknesses, multiple devices of other materials for which order of epitaxial layer growth by a process affects junction performance, and various source, drain, and gate connections and types.

We claim:

1. A channel for a high electron mobility transistor, comprising:
   (a) two heterojunction structures, each of said heterojunction structures characterized by a layer of a first semiconductor material formed on a layer of a second semiconductor material;
   (b) a connecting layer between said structures, a first surface of said connecting layer formed abutting said layer of said first material of a first of said structures, the second surface of said connecting layer formed abutting said layer of said second material of the second of said structures; and (c) said connecting layer characterized by semiconductor material which is graded from said first surface to said second surface, which at said first surface is substantially the same as said first semiconductor material, and which at said second surface is substantially the same as said second semiconductor material.

2. The transistor channel of claim 1, wherein:
(a) said first material is an aluminum gallium arsenide alloy ($Al_xGa_{1-x}As$); and
(b) said second material is gallium arsenide.

3. The transistor channel of claim 2, wherein:
(a) said alloy is $Al_xGa_{1-x}As$ with x approximately 0.3.

4. The transistor channel of claim 1, wherein:
(a) said heterojunction structures are characterized by molecular beam epitaxial growth of said first material on said second material.

5. The transistor channel of claim 1, wherein,
(a) said first material in said structures is doped;
(b) said second material in said structures is undoped; and
(c) said material in said connecting layer is undoped.

6. The transistor channel of claim 5, further comprising:
(a) a spacer layer in each of said structures, said spacer layer comprising an undoped portion of said layer of said first material, said portion adjacent said layer of said second material.

7. A field effect semiconductor device, comprising:
(a) a channel region between a source and a drain and under a gate in a semiconductor body,
(b) said channel region including a stack of at least two heterojunction structures with a connecting layer between and abutting adjacent structures, said structures characterized by a layer of a first semiconductor material formed on a layer of a second semiconductor material, and said connecting layer characterized by semiconductor material which is graded from abutment with said first structure to abutment with said second structure, which at abutment with said first structure is substantially the same as said first material, and which at abutment with said second structure is substantially the same as said second material.

8. The device of claim 7, wherein:
(a) said device material is an aluminum gallium arsenide alloy ($Al_xGa_{1-x}As$); and
(b) said second material is gallium arsenide.

9. The device of claim 8, wherein:
(a) said alloy is $Al_xGa_{1-x}As$ with x approximately 0.3.

10. The device of claim 7, wherein:
(a) said heterojunction structures are characterized by molecular beam epitaxial growth of said first material on said second material.

11. The device of claim 7, wherein,
(a) said first material in said structures is doped;
(b) said second material in said structures is undoped; and
(c) said material in said connecting layer is undoped.

12. The device of claim 11, further comprising:
(a) a spacer layer in each of said structures, said spacer layer comprising an undoped portion of said layer of said first material, said portion adjacent said layer of said second material.

* * * * *